United States Patent
Varma

(10) Patent No.: US 6,310,500 B1
(45) Date of Patent: Oct. 30, 2001

(54) RACE REMOVAL OR REDUCTION IN LATCHES AND LOOPS USING PHASE SKEW

(75) Inventor: Pradeep Varma, New Delhi (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/602,206

(22) Filed: Jun. 23, 2000

(51) Int. Cl.$^7$ .................................................. H03K 3/356
(52) U.S. Cl. ........................................ 327/211; 327/219
(58) Field of Search ..................................... 327/201, 202, 327/211, 212, 213, 215, 218, 219, 292, 293, 294, 299; 714/726

(56) References Cited

U.S. PATENT DOCUMENTS

| | | | |
|---|---|---|---|
| 5,081,377 | * | 1/1992 | Freyman .............................. 327/202 |
| 5,654,658 | * | 8/1997 | Kubota et al. ........................ 327/203 |
| 5,905,393 | * | 5/1999 | Rinderknecht et al. ............. 327/210 |
| 5,999,030 | * | 12/1999 | Inoue .................................... 327/202 |

FOREIGN PATENT DOCUMENTS

| | | | |
|---|---|---|---|
| 406006185 | * | 6/1992 | (JP) ..................................... 327/202 |
| 406140885 | * | 10/1992 | (JP) ..................................... 327/202 |
| 406188695 | * | 12/1992 | (JP) ..................................... 327/202 |

* cited by examiner

Primary Examiner—My-Trang Nuton
(74) Attorney, Agent, or Firm—McGuireWoods, LLP; Stephen C. Kaufman

(57) ABSTRACT

A method for resolving race conflicts in a loop circuit having a forward path and a feedback path includes enabling and disabling the feedback path in accordance with a phase waveform. The phase waveform may be a system clock, in which case one of two approaches may be used to ensure that data from the feedback loop arrives later in time than data from an input signal line. During the first approach, only the rising edge of a clock signal used to control data flow in the feedback loop is delayed relative to the rising edge of a clock signal that controls data flow in the forward path. During the second approach, both the rising and falling edges of the clock signal are delayed. Through these approaches, the method of the present invention achieves improved performance in terms of power consumption, frequency response, area, and switching capacitance.

19 Claims, 11 Drawing Sheets

CONVENTIONAL CIRCUIT

CONVENTIONAL CIRCUIT

CONVENTIONAL CIRCUIT

CONVENTIONAL CIRCUIT

CONVENTIONAL CIRCUIT

CONVENTIONAL CIRCUIT

CONVENTIONAL CIRCUIT

CONVENTIONAL CIRCUIT

RACE REMOVAL OR REDUCTION IN LATCHES AND LOOPS USING PHASE SKEW

BACKGROUND OF THE INVENTION

FIELD OF THE INVENTION

The present invention generally relates to logic circuits, and more particularly to a system and method for controlling the flow of data in loop circuits used, for example, in semiconductor memory devices.

BACKGROUND DESCRIPTION

Latches and other types of loop circuits are commonly used in digital design, and are especially prevalent in the flip-flop circuits of a semiconductor memory device. Improving operational efficiency of latches and loops, thus, has become a major concern of digital circuit designers.

FIGS. 1(a)–(c) show three conventional latch circuits, each of which is phased by a logic voltage P, with P' being the complement of P. In the latch of FIG. 1(a), a phased inverter 2 is included along a forward path and a phased inverter 4 along a feedback path. In the latch of FIG. 1(b), a plain (e.g., unphased) inverter 6 is connected to a switch 8 along a forward path and an inverter 10 is connected to a switch 12 along a feedback path. In the latch of FIG. 1(c), two plain inverters 14 and 16 are connected in series to a switch 18 along a forward path, and a single switch 20 is included along a feedback path. Each of these latch circuits have input and output terminals, as shown, and the phased inverters are gated inverters. A well known implementation phased inverters 2 and 4 is shown in FIG. 2, and an implementation of the switches of FIGS. 1(b) and 1(c) is shown in FIG. 3.

In operation, the latch circuits are enabled when P is at logic 1 and disabled when P is at logic 0. When enabled, signals from the input terminal and the output terminal race to set each other—the input tries to set the output via the forward path and (the preexisting value at the) output tries to set the input via the feedback path. The node that wins determines the resulting state of the latch. In order to ensure proper operation, the signal from the input terminal must always set the output. This means that the race in each latch has to be fixed so that the input terminal signal always wins.

A conventional method for fixing the race so that the input terminal signal always wins is shown in FIGS. 1(a)–(c). Each feedback path is surrounded by a dashed box, which is labeled by a star (*). The star indicates that the path is weak or resistive compared to the forward path between the input and output terminals. The choice of a sufficiently large relative resistance ensures that the output always loses the race, resulting in the proper functioning of the latches.

The problems associated with using a resistive path in deciding a race conflict are as follows. A resistive path is typically implemented by increasing the length of a MOS-FET's channel in comparison to its width. This increases the area of the transistor, with a concomitant increase in switching capacitance. Also, power consumption increases, both due to the increase in switching capacitance and due to the node setting races entertained (albeit in a fixed manner) by the solution. These two causes can also reduce the speed of operation of the circuit. Alternatives to increased switching capacitance can increase the number of transistors used in circuit implementation.

A need therefore exists for a method for resolving race conflicts in a loop circuit, such as a latch, in a more efficient manner compared with conventional methods.

SUMMARY OF THE INVENTION

It is a first object of the present invention to provide an improved method and apparatus for resolving race conflicts between input and output nodes of a loop circuit (e.g.,a latch), and especially one adapted for use in the flip-flop circuits of a digital memory.

It is a second object of the present invention to accomplish the first object by enabling/disabling a feedback path of the loop circuit using a phase waveform, and more specifically by skewing the phase of a signal that controls the flow of data along the feedback path relative to a signal that controls data flow along a forward path.

It is another object of the present invention to achieve the second object by delaying at least one of the rising and falling edges of a clock signal that drives the feedback path of the loop circuit, so that the feedback path outputs data to the forward path later in time than data supplied to the input node of the circuit, thereby ensuring that the data signal supplied to the input node always wins the race.

It is another object of the present invention to achieve the second object by delaying both the rising and falling edges of a clock signal which drives the feedback path of the looped circuit, so that the feedback path outputs data to the forward path later in time than data supplied to the input node of the circuit, thereby ensuring that the data signal supplied to the input node always wins the race.

It is another object of the present invention to provide a method and apparatus which resolves a race conflict between the input and output nodes of a looped circuit by using the combined approach of (1) skewing a phase signal for driving the feedback path and (2) making the feedback path weak or resistive.

It is another object of the present invention to apply the aforementioned method to unphased loop circuits once the loop circuits have been converted to a phased form.

These and other objectives of the invention are achieved by providing a method for controlling the flow of a signal in a loop circuit, wherein the loop circuit includes a signal line, an input node connected to the signal line, an output node, a forward path connected between the input node and output node, and a feedback path also connected between the input node and output node. In order to resolve race conflicts in the loop circuit, the method includes the step of generating a first control signal for controlling flow of a first data signal from the signal line to the output node along the forward path; inputting the first control signal into at least one circuit element along the forward path to cause the first data signal from the signal line to pass to the output node; generating a second control signal for controlling flow of a second data signal along the feedback path by generating skewing a phase of the second control signal relative to the first control signal so that said second data signal arrives at the input node after the first data signal supplied from said signal line; and inputting the second control signal into at least one circuit element along the feedback path.

The first and second control signals may be clock signals which drive the circuit elements along the forward and feedback paths, respectively. These clocks signals may be generated in accordance with one of two approaches. The first approach involves delaying a rising edge of the second control signal relative to the rising edge of the first control signal. The second approach involves delaying the rising and falling edges of the second control signal relative to the rising and falling edges of the first control signal. The rising and falling edges may be delayed by equal amounts. Further, race resolution may be introduced by making the feedback path resistive.

Through these approaches, the method of the present invention is able to achieve a number of advantages over conventional methods, including reduced power consumption, higher frequency response, reduced area, reduced design complexity, reduced number of transistors, reduced switching capacitance, and a reduced phase load in the form of, for example, a clock load.

In one embodiment of the loop circuit of the present invention, a circuit element along the feedback path is a phased (gated) inverter driven by the delayed clock signal and a circuit element along the forward path is a phased (gated) inverter driven by an undelayed clock signal.

In another embodiment, the forward and reverse paths each include an unphased inverter connected to a switch, with the switch in the forward path being driven by the undelayed clock signal and the switch in the feedback path being driven by the delayed clock signal.

In still another embodiment, the forward path includes two unphased inverters connected in series with a switch driven by the undelayed clock signal, and the feedback path includes a switch driven by the delayed clock signal.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The present invention is, in one respect, a method for resolving race conflicts in a loop circuit having a forward path and a feedback path situated between two nodes. The invention resolves these conflicts by enabling and disabling the forward and feedback paths to ensure that data from the feedback path arrives at the input node after data from, for example, a signal line. The present invention is, in a second respect, a loop circuit adapted to implement the various approaches taken by the method of the present invention. Through these approaches, the present invention resolves race conflicts in a loop circuit more efficiently than conventional methods.

Figure 4:
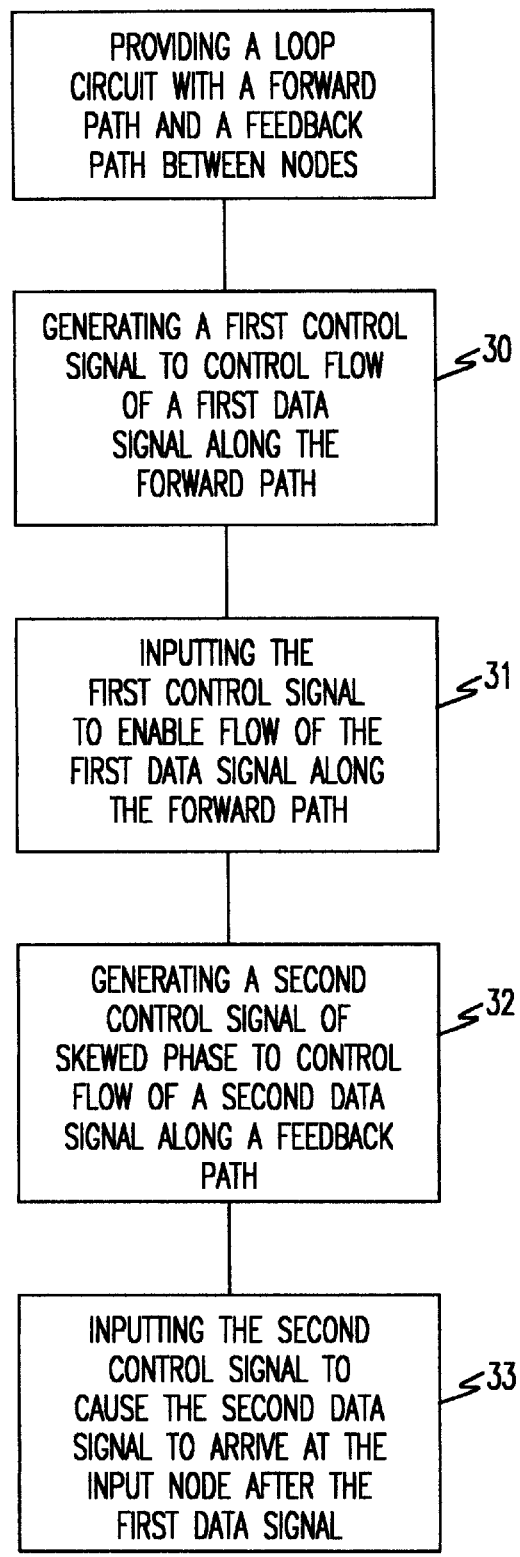
FIG. 4 is a flow diagram showing steps included in a preferred embodiment of the method of the present invention.

Referring to FIG. 4, a first embodiment of the method of the present invention resolves race conflicts in a loop circuit having a forward path and feedback path connected between an input node and output node. The method begins by generating a first control signal for enabling the flow of data along the forward path as supplied from a signal line connected to the input node. (Block 30). In a second step, the first control signal is input into at least one circuit element along the forward path to cause data to flow from the input node to the output node. (Block 31). In a third step, a second control signal is generated for controlling the flow of data along the feedback path. The second control signal is skewed in phase relative to the first control signal to ensure that data from the feedback path arrives at the input node after the data from the signal line. (Block 32). This second control signal is then input into at least one circuit element along the feedback path. (Block 33). Because the phase-skewed second control signal delays the input of data from the feedback path relative to the data from the signal line, the method of the present invention allows the input node to be set by the signal line, followed by the output node through the forward path, before the output node starts affecting the input node via the feedback path. This resolves any race conflict that may occur at the input node, thereby enuring proper operation of the loop circuit.

The specific steps of the method may be expected to change depending upon the configuration of the loop circuit. One particularly advantageous application of the method is within a latch, for example, of the type used to form flip-flops in a digital memory. Those skilled in the art can appreciate, however, that the present method may be implemented in any loop circuit where two signals compete for input into a node that connects two signal or data paths.

Figure 5A:
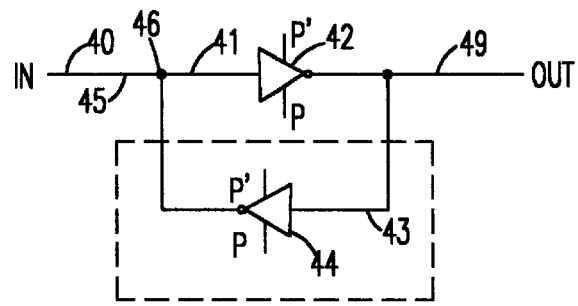
FIGS. 5(a)–(c) are diagrams of latch circuits configured in accordance with the present invention.
Figure 5B:
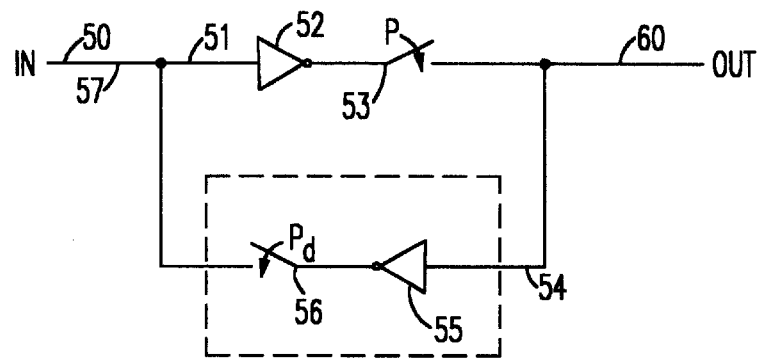
Figure 5C:
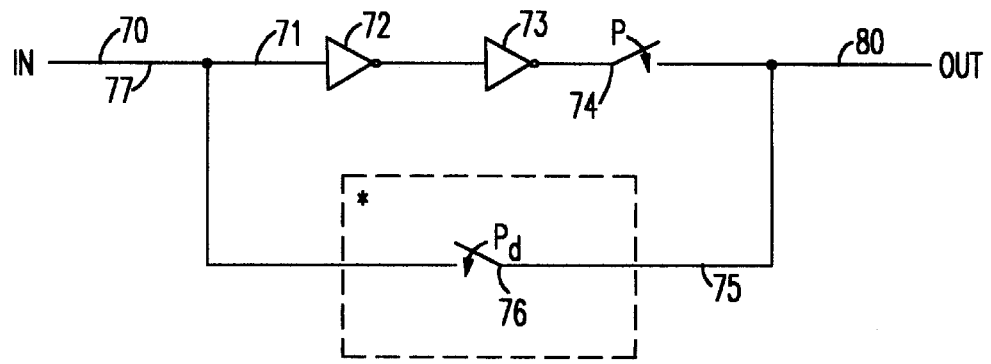

FIGS. 5(a)–(c) show three latch circuits implemented in accordance with the present invention. In FIG. 5(a), a latch circuit is shown as including a forward path and a feedback path connected between an input terminal 40 and output terminal 49. The forward path 41 includes a phased inverter 42 enabled in accordance with a control signal P, the complement of which is P'. The feedback path 43 includes a phased inverter 44 enabled in accordance with a control signal $P_d$, the complement of which is $P_d'$. A signal line 45 is connected to the input node.

Commonly, control signals P and $P_d$ are clock signals (other signals such as preset and clear may be used similarly to force latch values). If P and $P_d$ are clock signals, then phased inverter 42 operates during the low value of the clock P. In order to resolve race conflicts, clock signal $P_d$ is delayed relative to clock signal P by an amount sufficient to ensure that the data signal passing through phased inverter 44 along the feedback path arrives at node 46 after signal line 45 has input its data to the forward path, and through that path, modified output node 49.

This may be accomplished using one of two approaches in accordance with the present invention.

The First Approach

The first approach involves delaying the rising and falling edges of clock signal $P_d$ relative to the rising and falling edges of clock signal P. The amount of delay on each edge may be different, as long as the delay causes data to reach node 46 after data has been input from the signal line. Preferably, the rising and falling edges are delayed by an equal amount, as this is relatively straightforward to implement as described herein.

Figure 14:
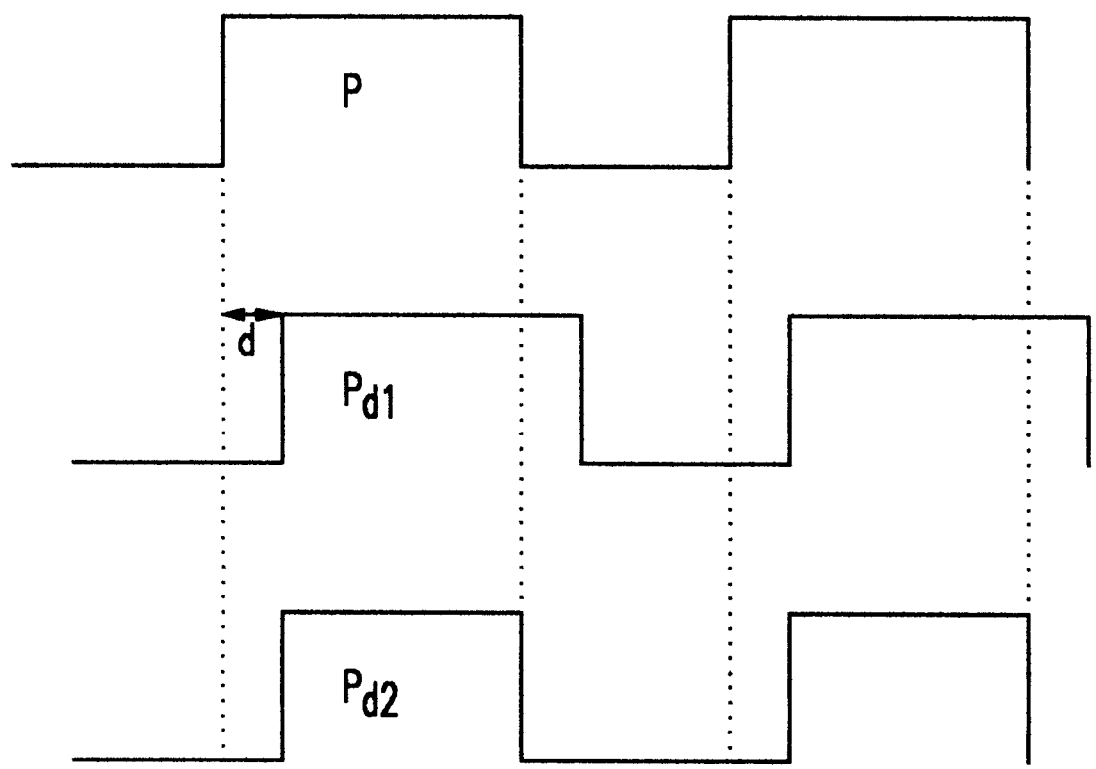
FIG. 14 shows illustrative timing diagrams of clock signals P, $P_{d1}$, and $P_{d2}$ which may be used in accordance with the present invention.

Delay "d" has to be larger than the RC time constant of the forward path from terminal 40 to terminal 49. This is to let the input signal decide the output before the feedback path is enabled. Delay "d" has to be smaller than the time period of the clock P so that $P_d$ remains only as a skewed version of P such that the design of latch and its surrounding system can be carried out using P as the clock. FIG. 14 shows illustrative timing diagrams of clock signals P and $P_d$ ($P_d$ is labeled $P_{d1}$ in order to also show another related, skewed signal in the same figure, as discussed later).

The Second Approach

The second approach involves delaying only the rising edge of clock signal $P_d$. The falling edge may coincide with the falling edge of clock P. The consideration for choosing a value of delay "d" remains the same as in the first approach. FIG. 14 shows an illustrative timing diagram of clock signal $P_d$ (identified as $P_{d2}$ in the figure for clarity), in relation to the clock signal P. The skewed clock signals of the two approaches can be compared in the same figure.

Through these two approaches, the present invention resolves race conflicts at the input node of a loop circuit, thereby ensuring proper operation. Also, because this delayed clock signal resolves race conflicts at the input node, feedback path 43 is not required to be resistive; although, if desired, this approach may also be taken. Further, for convenience purposes, input node 46 may be fed by an ordinary phased stage that only feeds its output and does not get perturbed by initial contests. An example of such a stage is a phased inverter. The first and second approaches will now be discussed with respect to the circuits of FIGS. 5(a)–(c).

Applying the first approach in FIG. 5(a), it is seen that the feedback path 43 remains enabled for a time longer than the forward path 42. This means that insofar as the input node is concerned, the latch is not disabled for a duration equal to the delay "d" when P is low. This only occurs in the beginning of the period when P is low, but an effect of this is that it rules out a straightforward use of a similar latch for feeding the input node. Suppose the input node were indeed fed by a similar latch. Then, the latch would be busy trying to have its forward path win a race with its feedback path. The last thing that the latch would need would be a reverse path from another latch contesting its forward path. Note that in the above, the delay "d" of the falling edge does not benefit the cause of race resolution. In this sense, the second approach discussed below is better than the first approach. The first approach is meritorious despite the cost of initial contest because it is relatively straightforward and inexpensive to implement.

Applying the second approach in FIG. 5(a), the rising edge of clock signal $P_d$ would be delayed by an amount "d" relative to clock signal P. As a result, activation of phased inverter 44 would be delayed, thereby causing the data from the feedback path to reach input node 40 after signal line 45 input its data into the forward path. The falling edge of $P_d$ is set to coincide exactly with the falling edge of P. Hence, no contest results between the input node and the output node when P is low.

In FIG. 5(b), a latch circuit is shown as including a forward path and a feedback path connected between an input terminal 50 and an output terminal 60. The forward path 51 includes an ordinary (unphased) inverter 52 connected to a switch 53, which is enabled in accordance with control signal P. The feedback path 54 includes an ordinary (unphased) inverter 55 connected to a switch 56, which is enabled in accordance with a control signal $P_d$, the complement of which is $P_d'$. A signal line 57 is connected to the input node. Control signals P and $P_d$ are preferably the same type of clock signals described above with reference to FIG. 5(a). Furthermore, input node 50 may be fed by an ordinary phased stage (e.g., a phased inverter) that only feeds its output and does not get perturbed by initial contests.

Applying the first approach for delaying clock signal $P_d$ relative to clock signal P, it is seen that the feedback path 54 remains disabled for a time longer than the forward path 51. This means that insofar as the input node is concerned, switch 56 is not closed for a duration equal to the delay "d" when P is set high. As a result of this delay, data from the feedback path arrives at the input node after signal line 57 input its data into node 60 via the forward path. As a result, no conflict occurs.

Applying the second approach, the rising edge of clock signal $P_d$ would be delayed by an amount "d" relative to clock signal P. As a result, the closing of switch 56 is delayed, thereby causing the data from the feedback path to reach input node 50 after signal line 57 inputs its data into the forward path. The falling edge of $P_d$ is set to coincide exactly with the falling edge of P. Hence, no initial contest results between the input node and the output node when P is low.

FIG. 5(c) shows a latch circuit which includes a forward path and a feedback path connected between an input terminal 70 and an output terminal 80. The forward path 71 includes two ordinary (unphased) inverters 72 and 73 connected in series with a switch 74, which is enabled by control signal P. The feedback path 75 includes a switch 76 which is enabled by a control signal $P_d$. A signal line 77 is connected to the input node. Control signals P and $P_d$ are preferably the same type of clock signals previously described. However, input node 70 cannot simply be fed by an ordinary phased stage, e.g., a phased inverter. This is because feedback path 75 is bidirectional. Thus, during the time that the forward path is off and the feedback path is on, the input node can drive the output path through the feedback path and reset it. To prevent this from happening, the feedback path must be made weak or resistive so that the RC time constant of the path from input to output via switch 76 is larger than delay "d."Thus the "short" through the resistive feedback becomes incapable of setting the output. Thus the feedback path in FIG. 5(c) is labeled with an asterisk, albeit a different asterisk (* ').

Applying the first approach for delaying clock signal $P_d$ relative to clock signal P, it is seen that the feedback path 75 remains disabled for a time longer than the forward path 71. This means that insofar as the input node is concerned, switch 76 is not closed for a duration equal to the delay "d" when P is high. As a result of this delay, data from the feedback path arrives at the input node after signal line 77 input its data into the output node via the forward path. As a result, no conflict occurs.

Applying the second approach, the rising edge of clock signal $P_d$ would be delayed by an amount "d" relative to clock signal P. As a result, the closure of switch 76 is delayed, thereby causing the data from the feedback path to reach input node 70 after signal line 77 inputs its data into the forward path. The falling edge of $P_d$ is set to coincide exactly with the falling edge of P. Hence, no contest results between the input node and the output node when P is low. This would let the latch of FIG. 4(c) also work without the use of extra resistance in its feedback path. However, since an exact overlap of the falling edges is difficult to realize, continuing with a weak feedback in FIG. 4(c) offers a margin of safety for the second approach also. With the second approach applied to FIG. 5(c), the set of stages which may feed the input node becomes larger. This is especially true if some amount of extra resistance is continued for the feedback path. Extra resistance allows the first approach to accept a larger set of stages for feeding the input. The use of phase skew in deciding the race conflicts provides an additional degree of flexibility in the choice of extra resistance (or none) that is desired for the purpose.

Figure 6A:
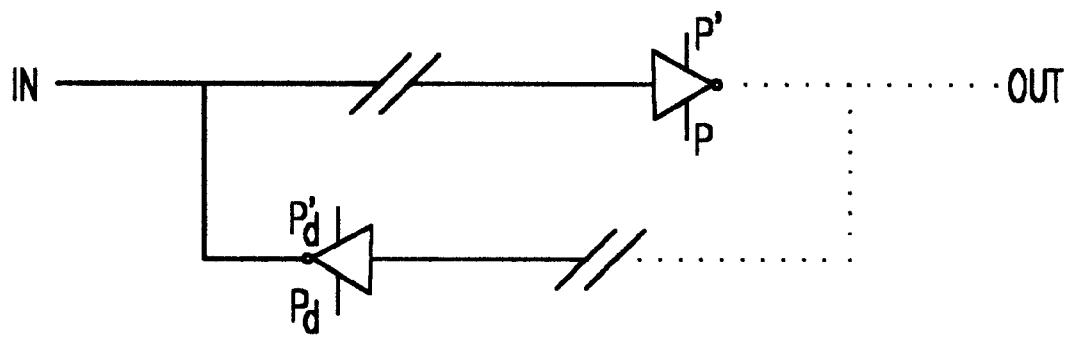
FIGS. 6(a) and (b) are diagrams of phased loops in accordance with the present invention.
Figure 6B:
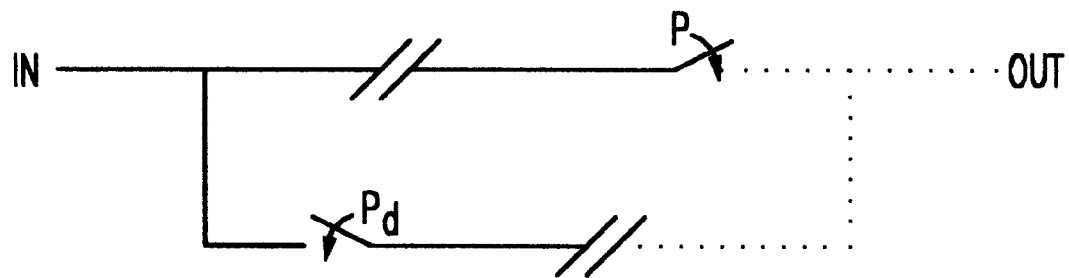

Consider next the phased loops in FIGS. 6(a) and (b). FIG. 6(a) shows a partial view of FIG. 5(a), and FIG. 6(b) shows partial views which correspond to FIGS. 5(b) and 5(c). In FIGS. 6(a) and (b), the bold lines represent paths which may be set by the input node when the loop is out of phase, i.e., disabled. The dashed lines are paths which may be set by the output node when the loop is out of phase. These paths can very well extend to the inputs of the switched components shown (phased inverters, switches), depending on the actual loop at hand. There may also be intermediate charge stored between the switched components and the bold/dashed areas, i.e. in the normal lines. The intermediate charge on the forward path drives the output and is driven by the input, and the intermediate charge on the feedback path drives the input and is driven by the output. The loops ensure that the race is settled in the favor of the input or the output as required. As shown, no weak components are included in FIGS. 6(a) and (b) for maintaining the delay required to resolve race conflicts. However, if desired, weak (or resistive) components may be used in conjunction with the method previously discussed.

Consider the exemplary case where the input alone is favored in the race and delays are shown only in the feedback paths in FIGS. 6(a) and (b). Favoring the output requires the delays to be on the forward paths. The operation of FIGS. 6(a) and (b), using phase skew, is therefore similar to that given for FIGS. 5(a)–(c). Basically, the feedback path is not enabled until the forward path has been used by the input to set the circuit. By the time the feedback path is activated, the only effect is that of reinforcing the charge at the input node.

Choice of input stages for the loops may be similar to FIGS. 5(a)–(c). It is noted that the loops shown in FIG. 6 are not all encompassing, e.g., there can be multiple forward paths and multiple feedback paths, and some of these paths may be shared among different loops. However, from the perspective of any given loop, when it is in phase, the phase delay in its feedback path compared to its forward path can decide the race in favor of its input node, as previously discussed.

Figure 7A:
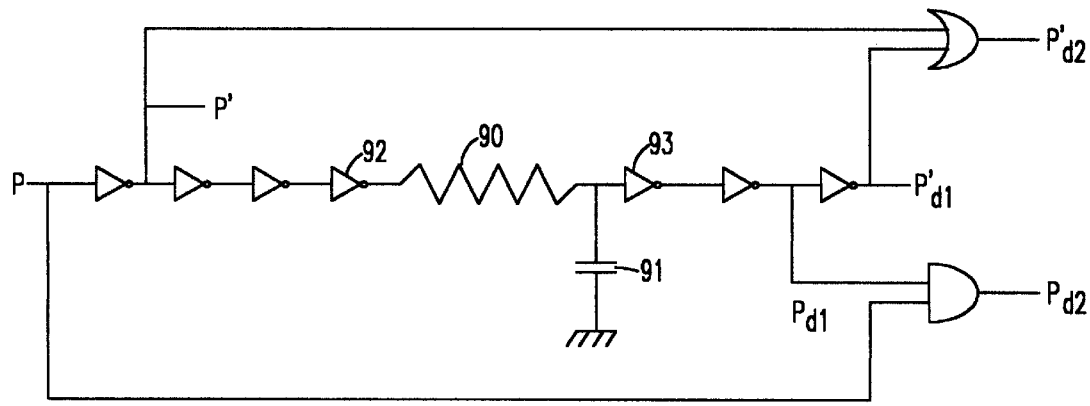
FIGS. 7(a) and (b) are diagrams of delay circuits which may be used for inverting the phase and generating the delayed phase and inverted phase signals in accordance with the present invention.

FIG. 7(a) shows a delay circuit in accordance with the present invention which may be used to generate a phase delay in the latch circuits previously described. In FIG. 7(a), an RC delay circuit including a resistor 90 and a capacitor 91 are shown before and after inverters 92 and 93 to ensure that even large delays can be introduced in a phase (for low frequency phase) without distorting the shape of the digital signal. Other circuits components like a Schmitt trigger may be used, but may not be needed in a large number of cases.

In the latch of FIG. 5(a), the inverse phase is shown. This, however, may not be needed in actual implementation because of a separate availability of the signal. Applying the delay circuit of FIG. 7(a) to this latch, the complement of P, namely P', is obtained after one inversion. $P_{d1}$ is obtained after a large, even number of inversions, and after passing through the RC delay circuit. The complement of $P_{d1}$, namely $P_{d1}'$, is obtained after an inversion of $P_{d1}$. The signals $P_{d1}$ and $P_{d1}'$ comprise the delayed phase according to the first approach previously discussed. To obtain the delayed phase according to the second approach, these signals are further treated as follows.

A logical AND of P and $P_{d1}$ yields the time when the phase according to the second approach should be high. This is shown as $P_{d2}$ in FIG. 7(a). $P_{d2}'$ can be obtained by directly inverting $P_{d2}$. However, a different route is followed that is symmetric to the derivation of $P_{d2}$. Specifically, $P_{d2}'$ is obtained by doing a logical OR of P' and $P_{d1}'$. Generally, a symmetric approach is likely to minimize the presence of any undesired extra skew between signals and their planned skew.

Figure 7B:
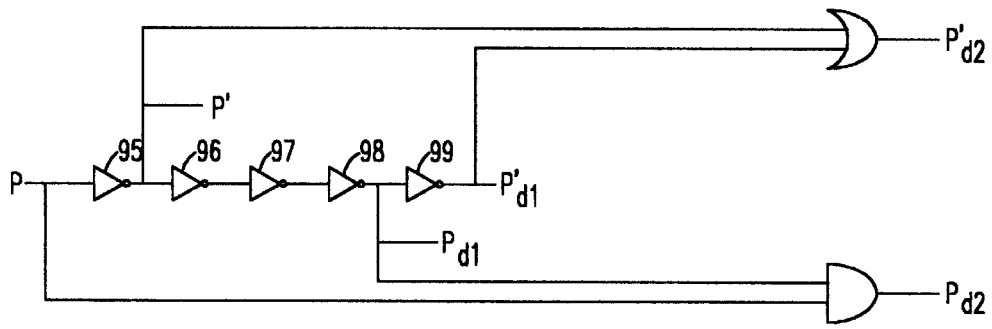

FIG. 7(b) shows a stripped down version of the delay circuit of FIG. 7(a) with the RC delay circuit removed. The delay in FIG. 7(b) is obtained solely by use of a sequence of inverters 95–99. The delay may also be manipulated by a choice of the W/L ratios of the transistors in the inverters. Advantageously, the number of inverters may be reduced to three in FIG. 7(b) for the purpose of obtaining $P_{d1}'$ and $P_{d1}$: two inverters for obtaining $P_{d1}$ and one more for obtaining $P_{d1}'$ from $P_{d1}$.

In the above embodiments, delay "d" may also be obtained implicitly by analyzing the line capacitance, stray capacitance at system level, and then using the ordinary load of the system to introduce delays in the phase worked with. The overhead of an explicit delaying circuit like FIG. 7(a) can also be amortized over multiple latches and loops that share the same phase.

Figure 1A:
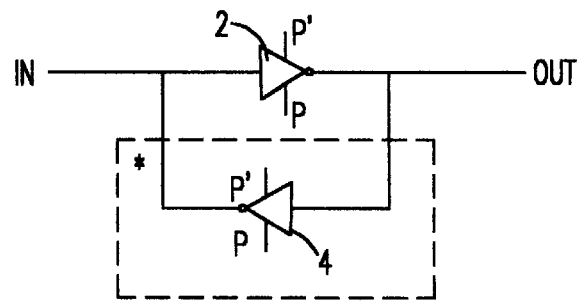
FIGS. 1(a)–(c) are diagrams of three latch circuits, each of which implements the conventional approach of resolving a race conflict discussed herein by making the feedback path weak or resistive.
Figure 8:
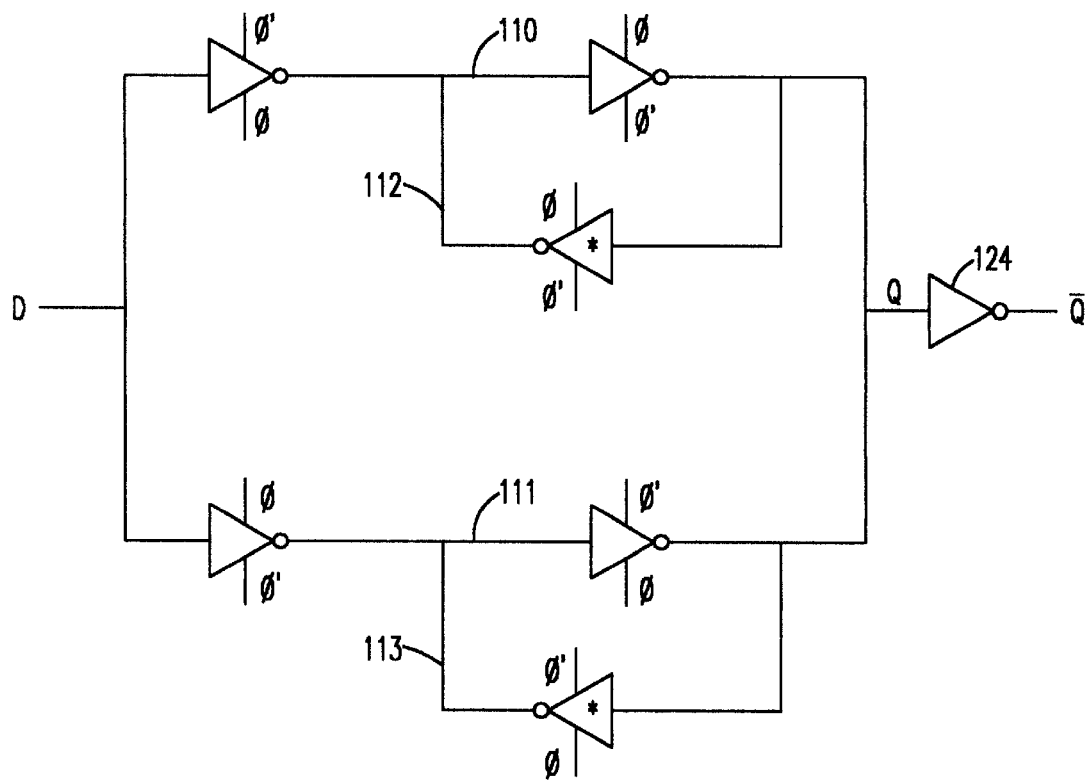
FIG. 8 is a well-known diagram of a static, double-edge-triggered flip constructed from conventional latch circuits.

FIG. 8 shows a schema for a static, double-edge-triggered flip similar to that in Gago, et al., "Reduced Implementation of D-Type DET Flip-Flops," IEEE Journal of Solid-State Circuits, Vol. 28, No. 3, pages 400–402, March 1993, except that it includes two latches 110 and 111 which correspond to the latches shown in FIG. 1(a). Both latches include inverters which operate in accordance with clock signals φ and φ'. To resolve race conflicts, feedback paths 112 and 113 are resistive or weak feedback paths, such as shown in FIG. 1(a).

Figure 9:
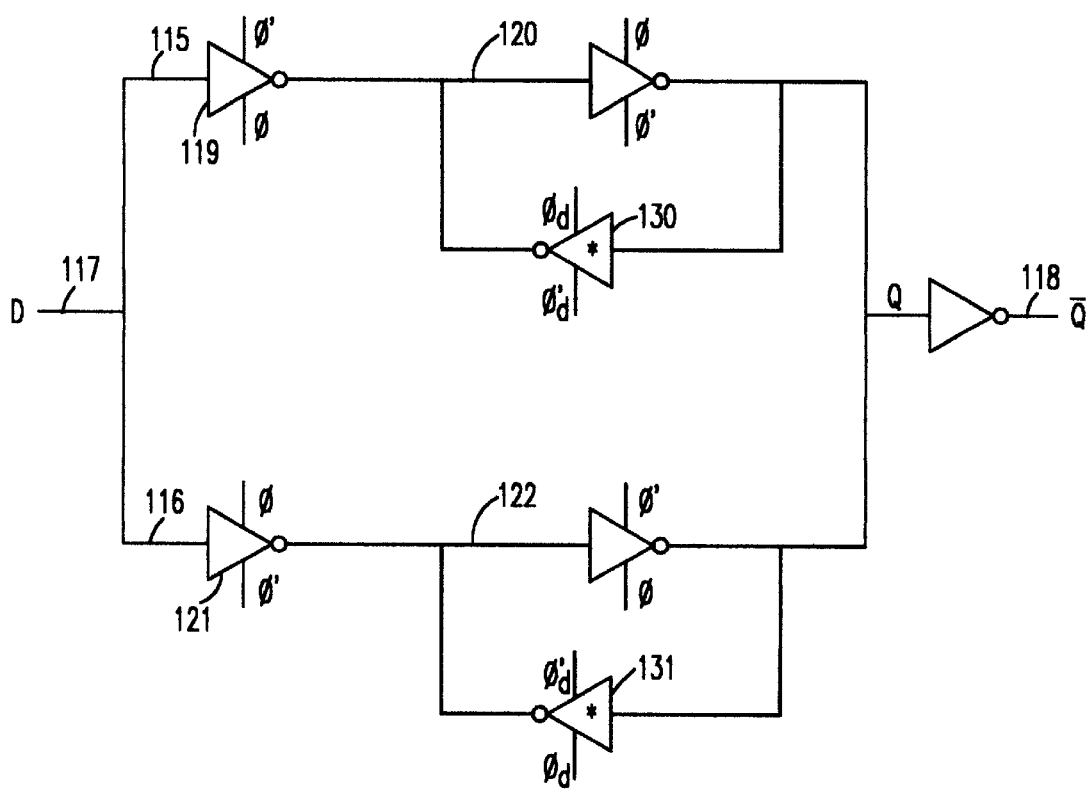
FIG. 9 is a diagram of a static, double-edge-triggered flip flop constructed in accordance with the present invention.

FIG. 9 shows a static, double-edge-triggered flip flop which includes an upper path 115 and a lower path 116 connected between an input terminal 117 and output terminal 118. The upper path includes a phased inverter 119 connected to a latch 120, and the lower path includes a phased inverter 121 connected to a latch 122. The upper and lower paths output data to the output terminal through an inverter 124. The flip flop of FIG. 9, thus, represents a conversion of the flip flop of FIG. 8, wherein the conventional latches and weak feedback paths of FIG. 8 have been replaced by latches 120 and 122 constructed in accordance with the present invention, for example, as shown in FIG. 5(a). The phase used to drive these latches is preferably a clock signal, so that inverters 130 and 131 operate in accordance with delayed clock signals $\phi_d$ and $\phi^{d'}$ generated in accordance with the first or second approaches previously discussed. Those skilled in the art can appreciate that the flip flop of FIG. 9 may, in the alternative, be constructed using either of the latches shown in FIGS. 5(b) and 5(c).

Figure 1B:
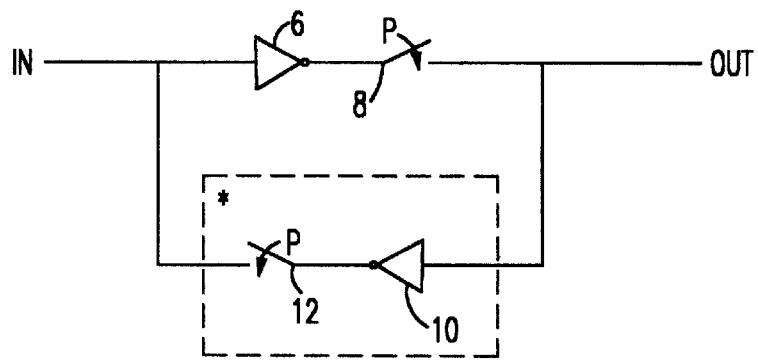
Figure 1C:
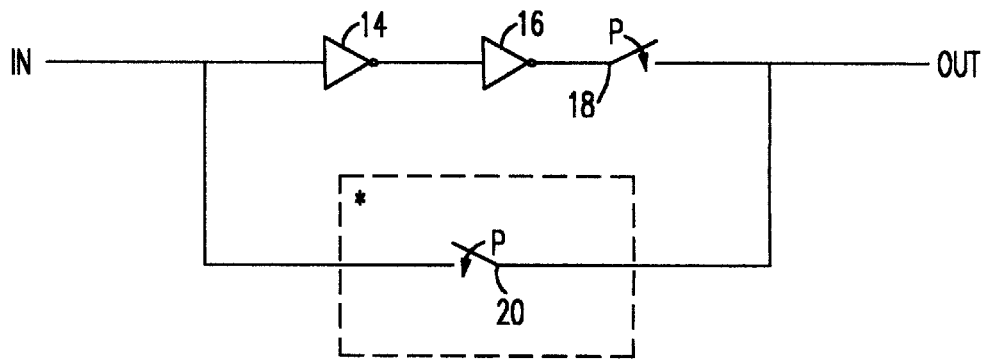
Figure 2:
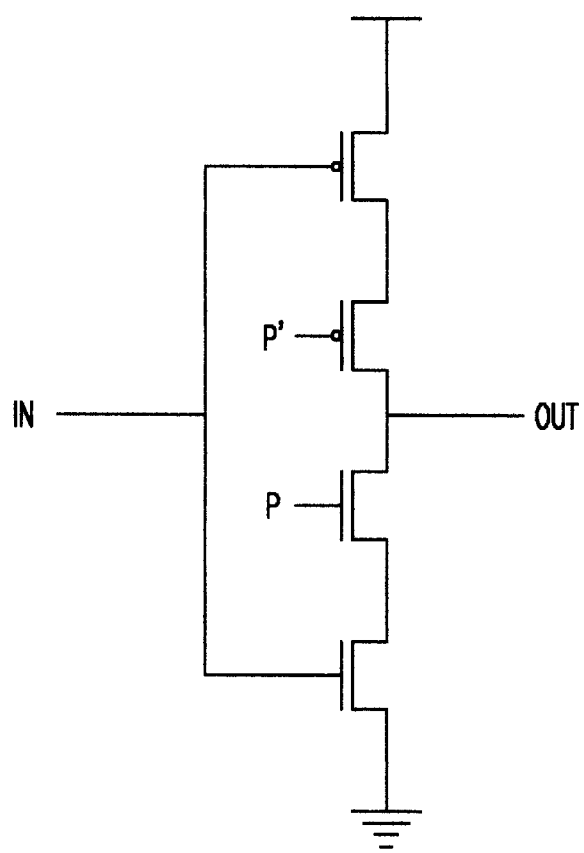
FIG. 2 is a diagram of a phased (gated) inverter commonly used in latch circuits.
Figure 3:
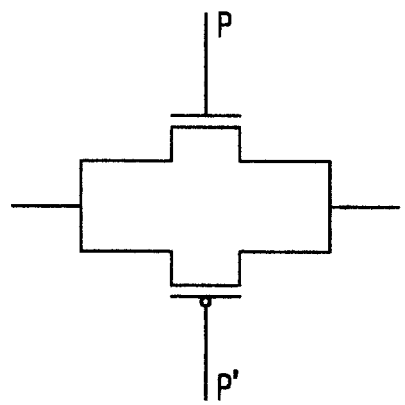
FIG. 3 is a diagram of a transmission gate implementation of a switch commonly used in latch circuits.
Figure 10:
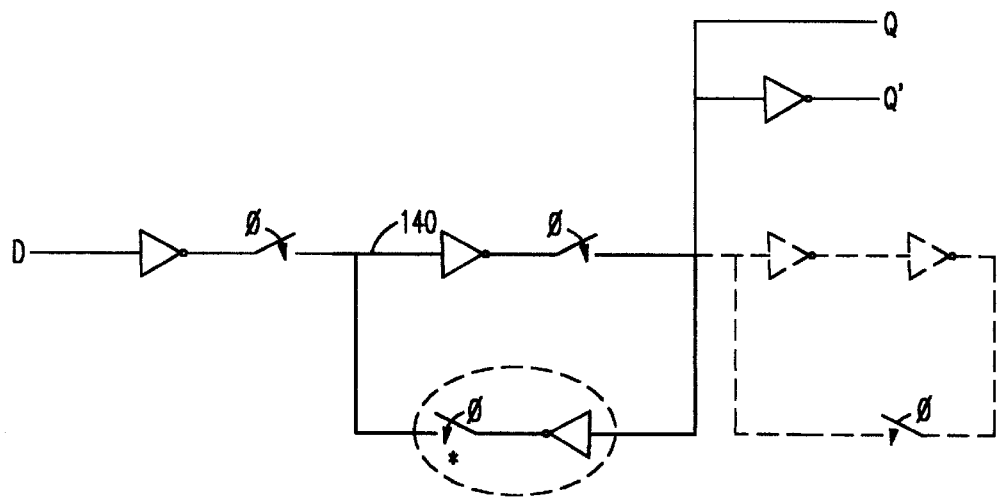
FIG. 10 is a diagram of a single-edge-triggered flip flop constructed from a conventional latch circuit of the type shown in FIG. 1(b).
Figure 11:
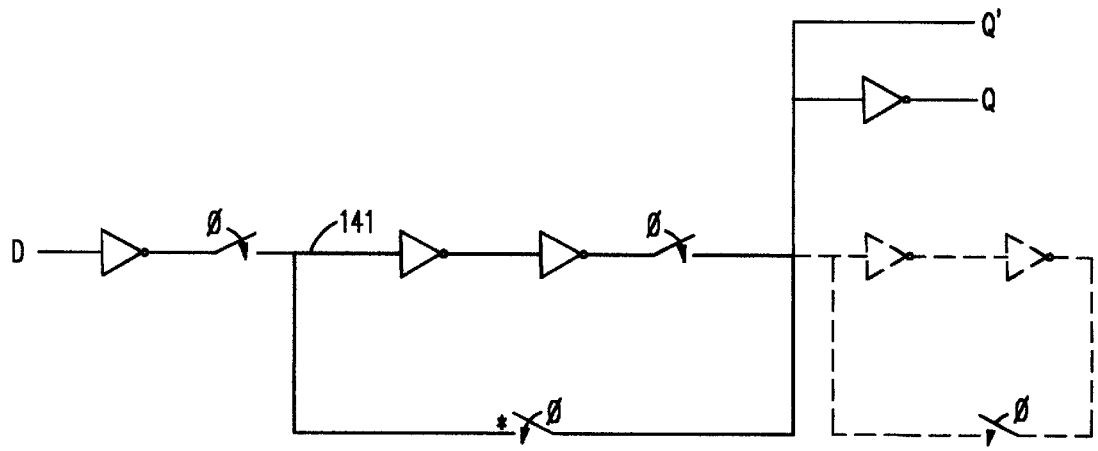
FIG. 11 is a diagram of a single-edge-triggered flip flop constructed from a conventional latch circuit of the type shown in FIG. 1(c).

FIG. 10 shows a single-edge-triggered flip flop with a weak-feed-back-based clocked latch 140 of the type shown in FIG. 1(b), and FIG. 11 shows a similar flip flop with a latch 141 of the type shown in FIG. 1(c). The latches are fed by an inverter and a clocked switch combination. FIGS. 10 and 11 also show a dotted latch each, which are dotted in order to emphasize that they are not the focus of attention of these flip flops using our method.

Figure 12:
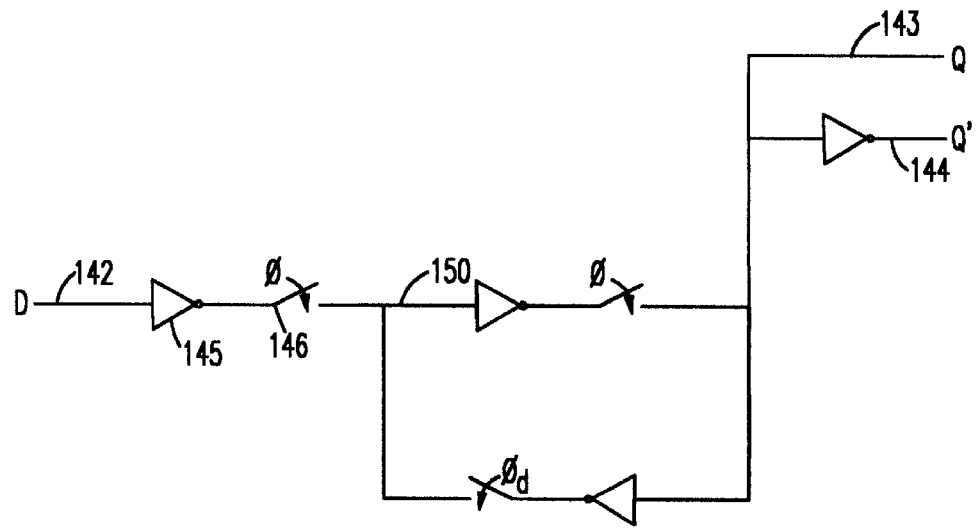
FIG. 12 is a diagram of a single-edge-triggered flip flop constructed in accordance with the present invention.
Figure 13:
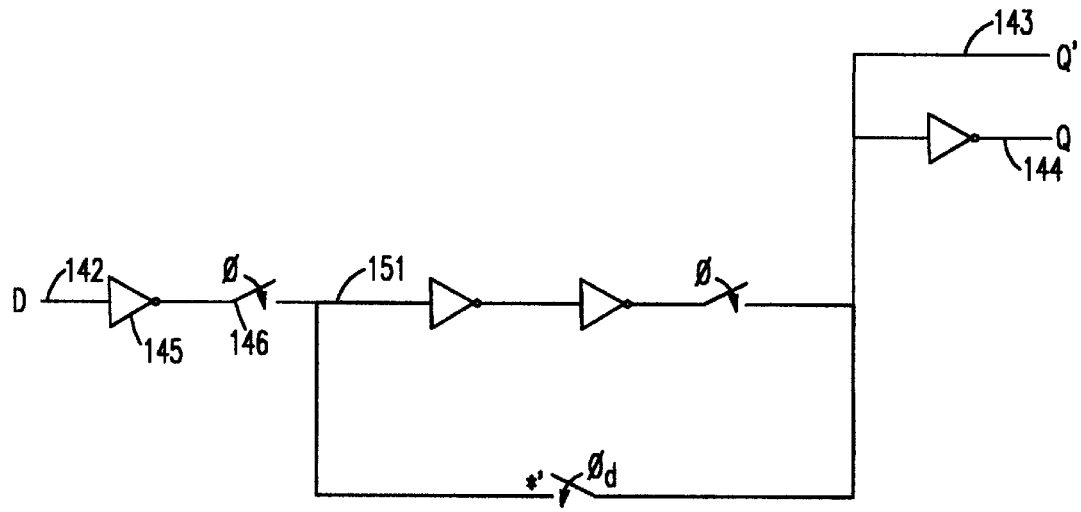
FIG. 13 is a diagram of another single-edge-triggered flip flop constructed in accordance with the present invention.

FIGS. 12 and 13 show single-edge-triggered flip flops, converted in accordance with the present invention from FIGS. 10 and 11 respectively, each of which include an input terminal 142, output terminals 143 and 144, an inverter 145 connected to the input terminal, a clock-controlled switch 146 connected to the inverter, and a latch connected between the inverter and output terminals. Unlike the flip flops of FIGS. 10 and 11, the latch 150 of FIG. 12 is a phase-skew (clocked-edge delay) latch of the type shown in FIG. 5(b), and the latch 151 of FIG. 13 is a phase-skew (clocked-edge delay) latch of the type shown in FIG. 5(c).

In sum, the present invention represents a substantial improvement over conventional circuits in that it achieves at least the following advantages: reduced power consumption, faster frequency response, reduced area, reduced design complexity, reduced transistor count, reduced switching capacitance and any concomitant clock load. Further, the cost of the present invention may be amortized over multiple latches and loops, resulting in overall benefit in circuit design. An even greater benefit may be obtained by expressing unphased loops and latches in terms of phased loops and latches, and letting the present method improve their performance. Each of these advantages are discussed in greater detail below.

First, the present invention improves power requirements by reducing or eliminating the race conflict between the forward and feedback paths by delaying the latter. However, the present invention may introduce a contest between the circuit feeding the input node and the feedback path due to a spillover of the delayed phase of the feedback path into out-of-phase time, with the spillover being bounded by delay d. (For producing the delay signal in accordance with the second approach of the invention, this spillover may not be of consequence). Regardless, for a small bound d, the benefit of in-phase contest elimination is likely to outweigh the cost of bounded, out-of-phase contest.

Second, since in-phase contest is eliminated, the charging time and the discharging time of the latch or loop is reduced. This means that the latch or loop can be switched with a higher frequency phase than before.

Third, area is reduced compared with conventional circuits. Conventionally, weak paths are commonly implemented using longer length transistors (e.g. in CMOS technology), which can increase the overall gate area of the transistors. Increasing the gate area results in a larger switching capacitance for the transistors concerned. In other conventional methods, weak transistors are implemented using more than one transistor in series. This also reduces the gate area of the switched transistors, and thus the switching capacitance, but increases the total number of transistors and overall area by introducing unswitched transistors. The present invention improves area, transistor count, switching capacitance and design complexity by eliminating or reducing the need for these weak/resistive paths. Reducing switching capacitance has additional benefits in terms of a further reduced power consumption and a faster frequency response, and if the phase used is a clock, clock load can be reduced.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method for controlling a flow of a signal in a loop circuit, said loop circuit including a signal line, an input node connected to the signal line, an output node, a forward path connected between the input node and output node, and a feedback path also connected between the input node and output node, said method comprising:

(a) generating a first control signal for controlling flow of a first data signal, as supplied from said signal line, from the input node to the output node along said forward path;

(b) inputting said first control signal to at least one circuit element along said forward path to cause said first data signal supplied from said signal line to pass from the input node to the output node;

(c) generating a second control signal for controlling flow of a second data signal along said feedback path, said generating step including skewing a phase of the second control signal relative to the first control signal so that said second data signal arrives at the input node after the first data signal supplied from said signal line; and (d) inputting said second control signal directly to at least one circuit element along said feedback path, wherein said at least one circuit element is a phased inverter.

2. The method of claim 1, wherein said first control signal and said second control signal are clock signals which drive said circuit element along said forward path and said circuit element along said feedback path, respectively.

3. The method of claim 2, wherein said step (c) includes delaying a rising edge of said second control signal relative to a rising edge of said first control signal by an amount sufficient to ensure that said second data signal arrives at the input node after said first data signal.

4. The method of claim 2, wherein said step (c) includes delaying a rising edge and a falling edge of said second control signal relative to a rising edge and a falling edge of said first control signal by amounts sufficient to ensure that said second data signal arrives at the input node after said first data signal.

5. The method of claim 4, wherein said rising edge and falling edge of said second control signal are delayed by equal amounts.

6. The method of claim 1, further comprising:
making said feedback path resistive to independently delay unidirectional or bi-directional movement of data signals between input and output nodes.

7. A method for controlling a flow of a signal in a loop circuit, said loop circuit including a signal line, an input node connected to the signal line, an output node, a forward path connected between the input node and output node, and a feedback path also connected between the input node and output node, said method comprising:

(a) generating a first control signal for controlling flow of a first data signal, as supplied from said signal line, from the input node to the output node along said forward path;

(b) inputting said first control signal to at least one circuit element along said forward path to cause said first data signal supplied from said signal line to pass from the input node to the output node;

(c) generating a second control signal for controlling flow of a second data signal along said feedback path, said generating step including skewing a phase of the second control signal relative to the first control signal so that said second data signal arrives at the input node before the first data signal supplied from said signal line; and (d) inputting said second control signal directly to at least one circuit element along said feedback path, wherein said at least one circuit element is a phased inverter.

8. A loop circuit, comprising:

an input node;

an output node;

a forward path connected between the input node and output node;

a feedback path connected between the input node and output node;

a signal line connected to the input node;

a first controller which generates a first control signal that controls flow of a first data signal, as supplied from said signal line, from the input node to the output node along said forward path, said first controller inputting said first control signal to at least one circuit element along said forward path to cause said first data signal supplied from said signal line to pass from the input node to the output node; and a second controller which generates a second control signal that controls flow of a second data signal along said feedback path, said second controller generating said second control signal by skewing a phase of the second control signal relative to the first control signal so that said second data signal arrives at the input node after the first data signal supplied from said signal line; said second controller directly inputting said second control signal to at least one circuit element along said feedback path, wherein said at least one circuit element along said feedback path is a phased inverter.

9. The loop circuit of claim 8, wherein said first control signal and said second control signal are clock signals which drive said circuit element along said forward path and said circuit element along said feedback path, respectively.

10. The loop circuit of claim 8, wherein the circuit element along said forward path is a phased inverter controlled by said first control signal.

11. The loop circuit of claim 8, wherein said loop circuit is a latch.

12. The loop circuit of claim 8, wherein the circuit element along said forward path is an unphased inverter connected to a switch controlled by said first control signal.

13. A double-edge-triggered flip flop, comprising:

an input terminal;

an output terminal;

an upper path connected between the input terminal and output terminal, said upper path including a first phased inverter and a first latch connected to the first phased inverter, said first latch including a forward path and a feedback path;

a lower path connected between the input terminal and output terminal, said lower path including a second phased inverter and a second latch connected to the second phased inverter, said second latch including a forward path and a feedback path;

an inverter connected to said output terminal;

a first controller which generates control signals that control flow of data along the forward paths of said first latch and said second latch; and a second controller which generates control signals that control flow of data along the feedback paths of said first latch and said second latch, said control signals generated by said second controller having a skewed phase relative to said control signals generated by said first controller, wherein said skewed phase causes data from the feedback path of said first latch to arrive at the forward path of said first latch after a data input from said first phased inverter, and wherein said skewed phase causes data from the feedback path of said second latch to arrive at the forward path of said second latch after a data input from said second phased inverter.

14. The double-edge-triggered flip flop of claim 13, wherein said second controller delays a rising edge of said second control signal relative to a rising edge of said first control signal by an amount sufficient to ensure that said second data signal arrives at the input node after said first data signal.

15. The double-edge-triggered flip flop of claim 13, wherein said second controller delays a rising edge and a falling edge of said second control signal relative to a rising edge and a falling edge of said first clock signal by amounts sufficient to ensure that said second data signal arrives at the input node after said first data signal.

16. The loop circuit of claim 15, wherein said second controller delays said rising edge and falling edge of said second control signal by equal amounts.

17. The double-edge-triggered flip flop of claim 13, wherein said feedback path is resistive to independently delay unidirectional or bi-directional movement of data signals between input and output nodes.

18. The double-edge-triggered flip flop of claim 13, wherein said control signals generated by said first controller and said second controller are clock signals, said clock signals generated by said second controller being delayed relative to the clock signals generated by the first controller.

19. A loop circuit, comprising:

an input node;

an output node;

a forward path connected between the input node and output node;

a feedback path connected between the input node and output node;

a signal line connected to the input node;

a first controller which generates a first control signal that controls flow of a first data signal, as supplied from said signal line, from the input node to the output node along said forward path, said first controller inputting said first control signal to at least one circuit element along said forward path to cause said first data signal supplied from said signal line to pass from the input node to the output node; and a second controller which generates a second control signal that controls flow of a second data signal along said feedback path, said second controller generating said second control signal by skewing a phase of the second control signal relative to the first control signal so that said second data signal arrives at the input node after the first data signal supplied from said signal line; said second controller inputting said second control signal to at least one circuit element along said feedback path, wherein said second controller delays only one edge of said second control signal relative to one edge of said first control signal by an amount sufficient to ensure that said second data signal arrives at the input node after said first data signal.

* * * * *